United States Patent
Li et al.

(10) Patent No.: US 9,710,347 B2
(45) Date of Patent: Jul. 18, 2017

(54) HANDLING DEFECTIVE NON-VOLATILE MEMORY

(71) Applicant: FREESCALE SEMICONDUCTOR, INC., Austin, TX (US)

(72) Inventors: Yaoqiao Li, Suzhou (CN); Zhongyi Zhu, Suzhou (CN); Jianshun Qiu, Suzhou (CN); Guangxu Men, Suzhou (CN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/235,084

(22) Filed: Aug. 11, 2016

(65) Prior Publication Data

US 2017/0083418 A1 Mar. 23, 2017

(30) Foreign Application Priority Data

Sep. 22, 2015 (CN) .......................... 2015 1 0723965

(51) Int. Cl.
*G06F 11/20* (2006.01)
*G06F 3/06* (2006.01)
*G11C 29/04* (2006.01)
*G11C 29/00* (2006.01)

(52) U.S. Cl.
CPC .......... *G06F 11/2094* (2013.01); *G06F 3/065* (2013.01); *G06F 3/0619* (2013.01); *G06F 3/0638* (2013.01); *G06F 3/0679* (2013.01); *G11C 29/04* (2013.01); *G11C 29/76* (2013.01); *G06F 2201/805* (2013.01); *G06F 2201/85* (2013.01)

(58) Field of Classification Search
None
See application file for complete search history.

(56) References Cited

U.S. PATENT DOCUMENTS

| 4,376,300 | A | * | 3/1983 | Tsang | G11C 29/76 365/200 |
|---|---|---|---|---|---|
| 5,349,558 | A | | 9/1994 | Cleveland et al. | |
| 5,687,345 | A | * | 11/1997 | Matsubara | G06F 9/445 257/E21.683 |
| 5,717,636 | A | * | 2/1998 | Dallabora | H01L 27/115 257/E27.103 |
| 6,351,413 | B1 | * | 2/2002 | Micheloni | G11C 5/025 365/185.11 |
| 6,484,271 | B1 | * | 11/2002 | Gray | G11C 29/70 714/5.1 |

(Continued)

*Primary Examiner* — J. H. Hur
(74) *Attorney, Agent, or Firm* — Charles E. Bergere

(57) ABSTRACT

A non-volatile memory (NVM) system has a main NVM sector with multiple memory segments, a redundant NVM sector for storing recovery records, an address-matching circuit having multiple memory sections, each adapted to store a pair of main and substitute addresses, and an NVM controller. The NVM controller is configured to determine if a first memory segment of the main NVM sector is no longer usable and, consequently (i) create a recovery record for storage in the redundant NVM sector that includes the address of the first memory segment and the data associated with the first memory segment, and (ii) add a pair of main and substitute addresses to the address-matching circuit, where the main address is the address of the first memory segment and the substitute address identifies a substitute location for the data associated with the first memory segment.

13 Claims, 8 Drawing Sheets

(56) References Cited

U.S. PATENT DOCUMENTS

| | | |
|---|---|---|
| 7,216,277 B1 | 5/2007 | Ngai |
| 7,336,549 B2 | 2/2008 | Min |
| 7,949,913 B2 | 5/2011 | Norrod |
| 8,218,383 B1 | 7/2012 | Wu |
| 8,527,839 B2 | 9/2013 | Hung |
| 8,848,443 B2 | 9/2014 | Kim |
| 8,947,957 B2 | 2/2015 | Yu |
| 2002/0019961 A1 | 2/2002 | Blodgett |
| 2003/0035322 A1* | 2/2003 | Wong .................... G11C 5/025 365/185.33 |
| 2004/0123181 A1 | 6/2004 | Moon et al. |
| 2005/0190615 A1* | 9/2005 | Linde ................. G11C 29/4401 365/200 |
| 2008/0307251 A1 | 12/2008 | Rahman |

\* cited by examiner

HANDLING DEFECTIVE NON-VOLATILE MEMORY

BACKGROUND

The present invention relates to non-volatile memories (NVMs) and, more particularly, to techniques for handling defective non-volatile memory (NVM) segments.

FIG. 1 is a simplified block diagram of a portion of a conventional NVM system 100 configured for a 64-bit processing system (not shown)—in other words, a processing system having a data-bus width of 64 bits. The NVM system 100 comprises a main NVM sector 101, a redundant NVM sector 102, and an NVM controller 103. The NVM controller 103 controls the operations (e.g., writing, reading, erasing) for the main and redundant NVM sectors 101 and 102. The main NVM sector 101 comprises 128 64-bit memory segments 104 organized into 16 rows 105 and 8 columns 106. The redundant NVM sector 102 similarly comprises 128 64-bit memory segments 107 organized into 16 rows 108 and 8 columns 109. Each memory segment 104 in a row 105 shares common word lines (not shown) with all of the other memory segments 104 in that row 105. Similarly, each memory segment 104 in a column 106 shares common bit lines (not shown) with all of the other memory segments 104 in that column 106.

Each memory segment 104 and 107 stores one data bus width's worth of data, or 64 bits. Consequently, each row 105 and 108 stores 512 bits of data, or 64 bytes (using 8-bit bytes). Each sector 101 and 102, then, stores 1024 bytes, also called a kilobyte.

In one conventional implementation, the NVM sectors 101 and 102 are writable (in other words, programmable) and readable at the byte level, but are only erasable at the sector level. In other words, the unit for writing and reading has a size different from the size of the unit for erasing. Note that, in general, the size of the unit for writing may also be different from the size of the unit for reading. Note that a group of one or more sectors may be referred to as a block.

In one conventional implementation of the NVM system 100, if the NVM controller 103 determines that, for example, the memory segment 104(6)(2) is defective because, for example, the memory segment 104(6)(2) fails a verification operation after a write or erase operation, then the entire sector 101 is marked as a bad sector and, consequently, no longer usable. Instead, the NVM controller 103 substitutes the redundant sector 102 for the bad sector 101, where the NVM controller 103 redirects operations intended for any of the memory segments 104 within the bad sector 101 to memory segments 107 within the redundant sector 102.

In an alternative conventional implementation of the NVM system 100, if the segment 104(6)(2) is determined to be defective, then the corresponding row 105(6) is marked as a bad row, and a corresponding row 108, such as row 108(4), of the redundant NVM sector 102 is substituted for the row 105(6) containing the bad segment 104(6)(2).

In yet another alternative conventional implementation of the NVM system 100, if the segment 104(6)(2) is determined to be defective, then the corresponding column 106(2) is marked as a bad column, and a corresponding column 109, such as column 109(3), of the redundant NVM sector 102 is substituted for the column 106(2) of the bad segment 104(6)(2).

Note that the redirection may be effected by, for example, using fuse elements or muxes to redirect the word lines of a bad main row 105 or the bit lines of a bad main column 106 to the corresponding redundant row 108 or column 109. Accordingly, for example, if a redundant row 108(4) is substituted for a bad row 105(6), then read and write requests directed to, for example, the memory segment 104(6)(4) in the bad row 105(6) would be physically routed to the corresponding redundant memory segment 107(4)(4).

BRIEF DESCRIPTION OF THE DRAWINGS

Other aspects, features, and advantages of the invention will become more fully apparent from the following detailed description, the appended claims, and the accompanying drawings in which like reference numerals identify similar or identical elements. Note that elements in the figures are not drawn to scale.

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures.

A more efficient NVM repair system and methodology compensates for defective main NVM sectors at the segment level rather than at the row or column or even sector level as in the prior art. This enables the use of fewer redundant NVM sectors, as further detailed in the illustrative description below.

Figure 2:
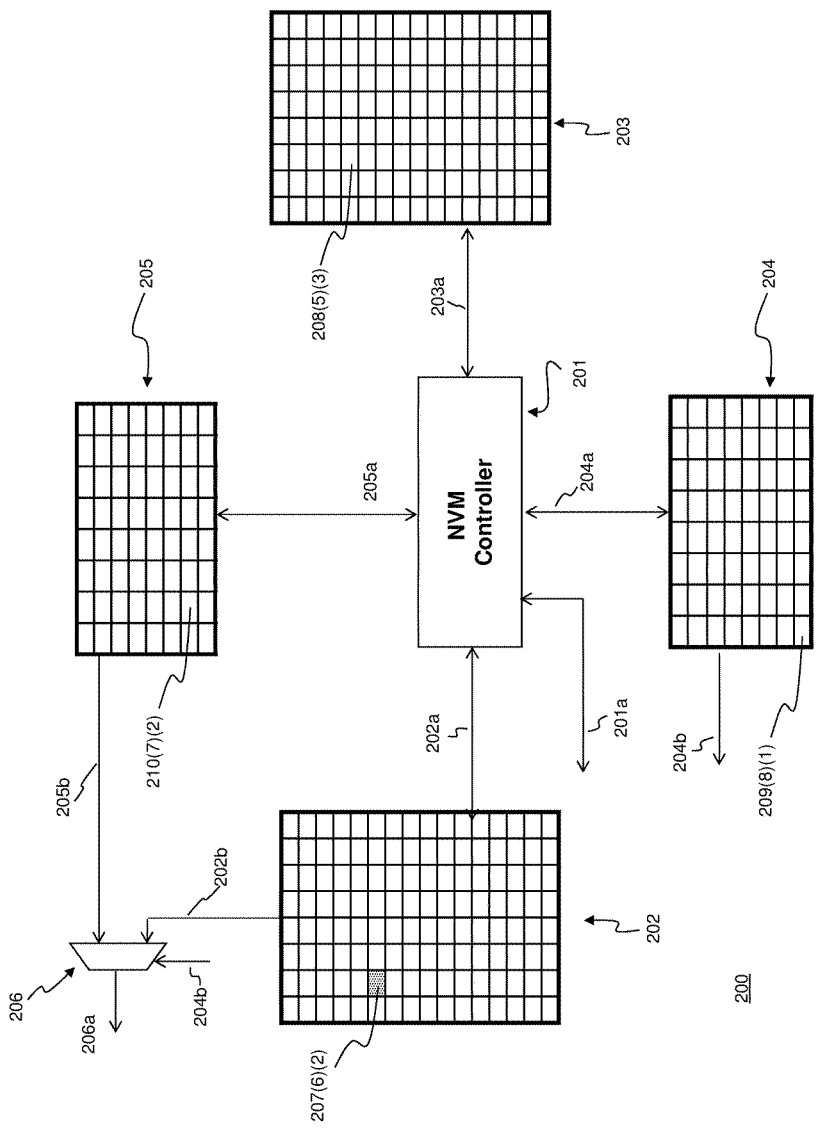
FIG. 2 is a simplified block diagram of an exemplary portion of an NVM system in accordance with one embodiment of the present invention.

FIG. 2 is a simplified block diagram of a portion of an NVM system 200 in an electronic processing device (not shown) in accordance with one embodiment of the present invention. Note that, as used herein, an NVM system refers to a system that uses NVM memory and that may also include volatile memory. The NVM system 200 comprises an NVM controller 201, a main NVM sector 202, a redundant NVM sector 203, a (volatile) address-matching circuit 204, a (volatile) random access memory (RAM) 205, and a mux 206. The NVM system 200 may comprise additional main NVM sectors similar to the main NVM sector 202 and/or additional redundant NVM sectors similar to the redundant NVM sector 203.

The NVM controller 201 communicates with the main NVM sector 202, the redundant NVM sector 203, the address-matching circuit 204, the RAM 205, and other components (not shown) of the electronic device via, respectively, data paths 202a, 203a, 204a, 205a, and 201a. Note that two or more of the various data paths, although shown as two-ended links, may be implemented as a shared (e.g., 64-bit-wide) data bus of the NVM system 200. Note that the NVM controller 201 may be implemented as a distinct entity or, alternatively, may have its functionality implemented by, for example, (i) another device controller and/or (ii) disparate logic circuits of the NVM system 200.

The NVM controller 201 uses the redundant NVM sector 203, the address-matching circuit 204, and the RAM 205 to handle defective segments in the main NVM sector 202 at the segment level. For each defective segment 207 in the main NVM sector 202, the RAM 205 stores the data that should have been stored in the defective segment 207, and the address-matching circuit 204 maps the address of the defective main segment 207 to the corresponding RAM address. The redundant NVM sector 203 stores information for re-programming the volatile address-matching circuit 204 and the volatile RAM 205 after the electronic device has been powered down and then turned on again.

Figure 1:
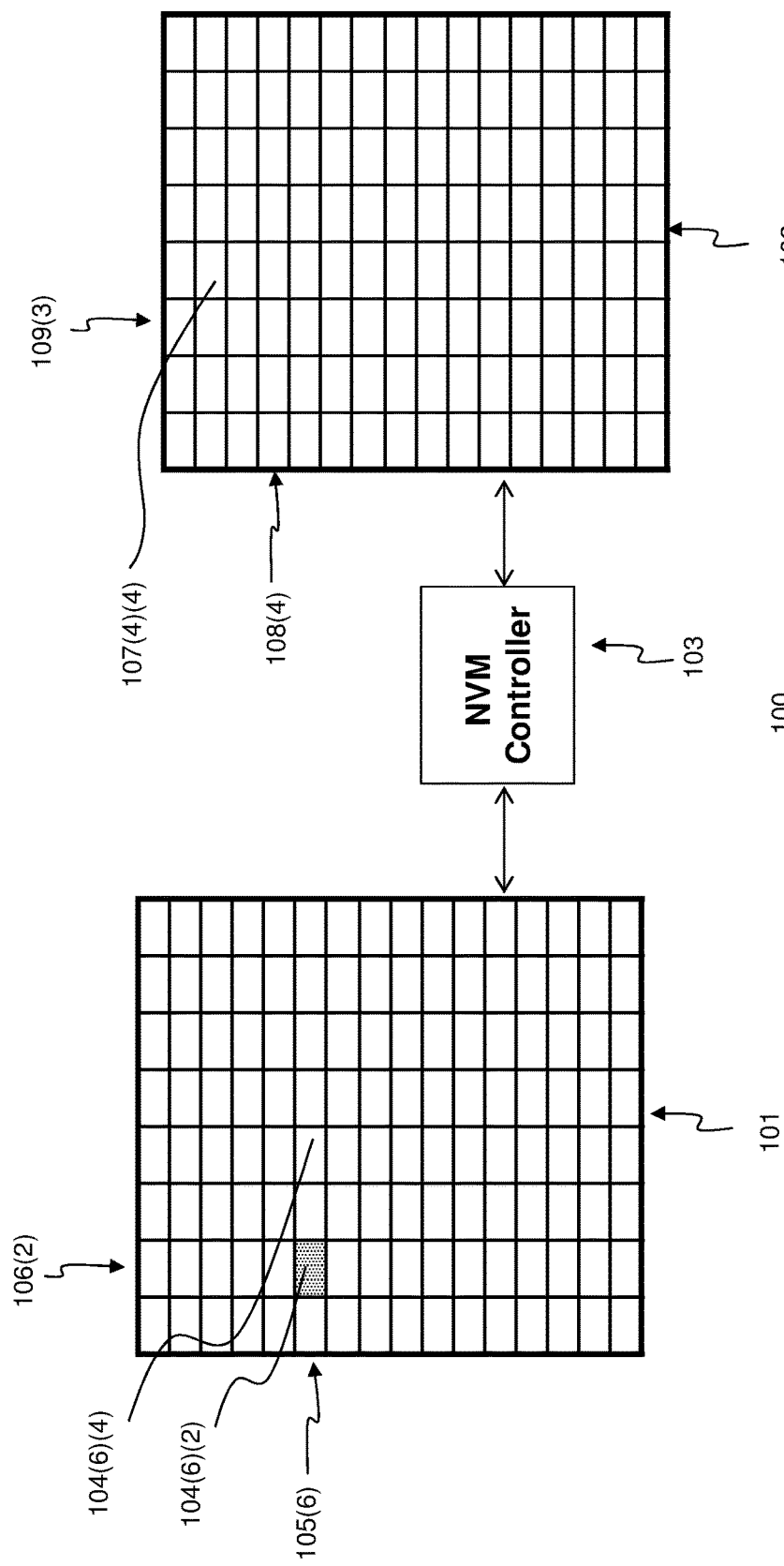
FIG. 1 is a simplified block diagram of a portion of a conventional non-volatile memory (NVM) system.

The main NVM sector 202 comprises 128 64-bit memory segments 207 organized into 16 rows and 8 columns, similar to the main NVM sector 101 of FIG. 1. Note that, while each memory segment 207 stores 64 bits, the contents of any particular memory segment 207 may be readable and/or writable at the byte level. In other words, NVM controller 201 may directly access, for reading and/or writing, any of the eight bytes of any memory segment 207 of the main NVM sector 202. Note that, in alternative embodiments, the minimum addressable size may be smaller or larger than an 8-bit byte.

All the memory segments 207 in a row of the main NVM sector 202 may share a common word line (not shown) and, similarly, all the memory segments 207 in a column of the main NVM sector 202 may share common bit lines (not shown) and sense amplifiers (not shown). The NVM system 200 may be organized such that the main NVM sector 202 shares word lines, bit lines, and/or sense amplifiers with other NVM sectors, including other main NVM sectors and/or redundant NVM sectors such as, for example, the redundant NVM sector 203.

The address-matching circuit 204 comprises 64 memory sections 209 adapted to store pairs of main addresses and substitute RAM addresses. Each main address is the address of a defective memory segment 207 of the main NVM sector 202 and the corresponding substitute RAM address is the address of the corresponding cache record in the RAM 205. The size of each memory section 209 will vary for different implementations depending on the bit lengths of the main and substitute RAM addresses. The address-matching circuit 204 may be implemented using content-addressable memory (CAM) to store and find the main and RAM addresses. The address-matching circuit 204 may also be implemented using an array of registers and corresponding parallel comparators (not shown).

The RAM 205 comprises 64 64-bit memory segments 210 usable as rapid-access substitutes for up to 64 defective memory segments 207 of the main NVM sector 202. In other words, a RAM memory segment 210 may be used to store the data that would otherwise be stored by a memory segment 207 of the main NVM sector 202, if that memory segment 207 were a usable memory segment.

When the NVM controller 201 provides an address to the address-matching circuit 204, the address-matching circuit 204 determines whether that provided address is one of the stored main addresses, as indicated by the binary output 204b. In response to determining that the provided address matches a main address, the address-matching circuit 204 also provides the corresponding substitute RAM address to the NVM controller 201 via signal path 204a. The NVM controller 201 uses the substitute RAM address to read and output the data stored in the corresponding RAM memory segment 210. In an alternative implementation, the address-matching circuit 204 provides (i) the binary output 204b to the NVM controller 201, and (ii) the substitute RAM address directly to the RAM 205 to read and output the data stored in the corresponding RAM memory segment 210.

The redundant NVM sector 203 is substantially similar to the main NVM sector 202 and similarly comprises 128 memory segments 208 organized into 16 rows and 8 columns, where each memory segment 208 is 64 bits. The redundant NVM sector 203 stores recovery records for bad memory segments 207 of the main NVM sector 202. Each recovery record includes at least the (e.g., 8-bit) main address of a bad memory segment 207 in the main NVM sector 202, the data—up to 64 bits—intended to be stored therein, and the corresponding (e.g. 8-bit) substitute RAM address, as stored by the address-matching circuit 204.

Typically, each recovery record also includes a one-bit validity flag that indicates whether or not the record is still valid. The validity flags are set as valid by default and may be programmed to indicate an invalid state.

As described previously with regard to the prior art of FIG. 1, in certain implementations, the non-volatile main and redundant sectors 202 and 203 are erasable only at the sector level. Assume, for example, that the main NVM sector 202 has two defective segments and that the redundant NVM sector 203 has two records corresponding to those two defective segments. If any part of the main NVM sector 202 is to be re-programmed with new data, then the entire main NVM sector 202 must be erased and then re-programmed. Note that as part of the erasure of the main NVM sector 202, two new recovery records will be added to the redundant NVM sector 203 for the two defective segments and the old recovery records will be marked as invalid. Subsequently, when write requests are directed to those defective segments, two additional new recovery records will be added to the redundant NVM sector 203 and the older recovery records will be marked as invalid. Note that the default state for unprogrammed validity flags of new recovery records is valid.

Note that, since a recovery record stored by the redundant NVM sector 203 may include more than 64 bits of information, any particular recovery record may take up more than one memory segment 208. Note that, if the NVM controller 201 determines that a memory segment 208 of the redundant NVM sector 203 is itself bad, then a corresponding validity flag of the memory segment 208 may be set to invalid to avoid use of that memory cell. Note that alternative, more complex, solutions, like a multi-bit flag, may be used to account for possible defects of the flag bit itself.

The NVM system 200 may be configured to detect and handle defects (i) during initial testing at the factory, (ii) during device power-up, and/or (iii) during normal operation, on the fly. The initial factory testing may include, for example, one or more cycles of write and erase testing. The handling processes in different operational modes share some features, but may also differ, as described below.

Figure 3:
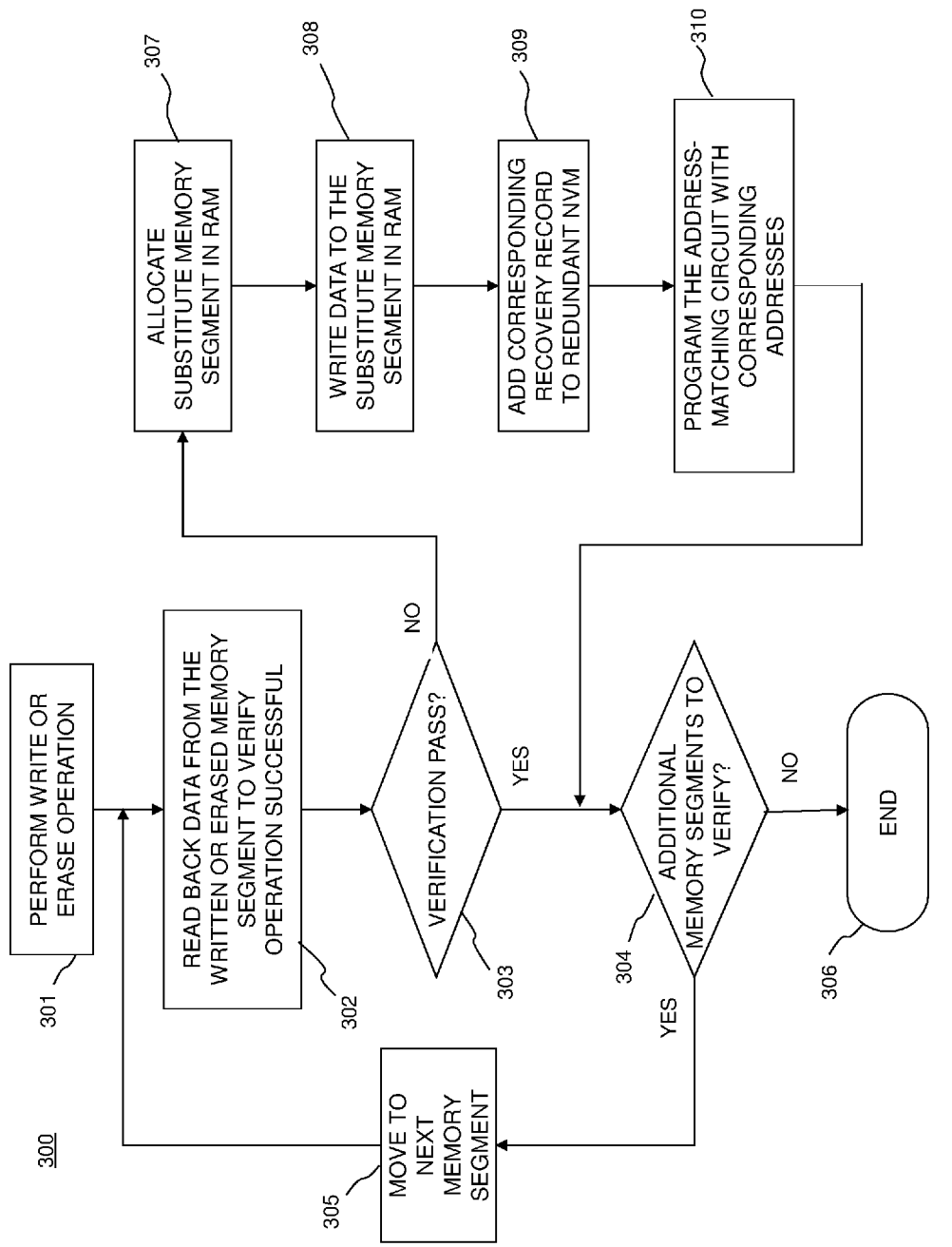
FIG. 3 is a flow chart for a process for initial error detection and correction, which can occur, for example, during factory testing or during normal operation of the portion of FIG. 2.

FIG. 3 is a flow chart for a process 300 for initial error detection and handling, which can occur, for example, during factory testing or during normal operation of the NVM system 200 of FIG. 2. The process 300 starts with a write or erase operation for a set of one or more memory segments 207 (step 301). Note that an erase operation, since it erases the entire main NVM sector 202, involves a plurality of memory segments 207.

Next, the NVM controller 201 reads back the data in a target memory segment 207—such as, for example, the memory segment 207(6)(2)—to verify successful write or erase (step 302). Specifically, write verification comprises reading back the programmed data and verifying that the memory segment 207 was correctly programmed, and erase verification comprises reading the data and verifying that the memory segment 207 was correctly erased. If the verification is successful (step 303), then (i) if there are additional memory segments 207 to verify (step 304), then the processes moves to the next memory segment 207 (step 305) and returns to step 302 and (ii) if there are no additional memory segments 207 to verify (step 304), then the procedure terminates (step 306).

If the validation failed (step 303), then the NVM controller 201 allocates a substitute memory segment 210 in the RAM 205—such as, for example, the memory segment 210(7)(2)—(step 307), writes the appropriate data to the substitute memory segment 210 (step 308), adds a corresponding recovery record to the redundant NVM sector 203–such as, for example, at the memory segment 208(5)(3)—(step 309), programs the address-matching circuit 204 with the corresponding main and substitute addresses—such as, for example, at the memory section 209(8)(1)—(step 310), and then returns to step 304 of the process 300.

Note that the recovery record in the redundant NVM sector 203 comprises (i) the address of the bad memory segment 207, (ii) the substitute address—e.g., the address of the allocated corresponding RAM memory segment 210—such as, for example, the RAM memory segment 210(7)(2), and (iii) the data intended for the bad memory segment 207. Note that, in an alternative embodiment, the process 300 may be modified by skipping the programming of the corresponding RAM memory segment 210, and/or the programming of the address-matching circuit 204, such that the only information stored—in a corresponding recovery record in the redundant NVM sector 203—is the address of the bad memory segment 207 in the main NVM sector 202 and the substitute address in the RAM 205. This alternative embodiment may be useful, if, for example, (i) the electronic processing device is to be powered down after termination of the process 300 or (ii) if there will not be read requests for the bad memory segment 207 until after the next device power up, when the RAM 205 and the address-matching circuit 204 will be initialized.

Note that write verification and/or erase verification may skip, or ignore results of, verification of memory segments 207 already designated as bad memory segments.

During normal operation, if the NVM controller 201 determines that a memory segment 207 that was previously designated as good has now gone bad—by, for example, failing a write or erase verification—then the NVM controller 201 accordingly adds corresponding records to the redundant NVM sector 203, the address-matching circuit 204, and the RAM 205, as described above.

Figure 4:
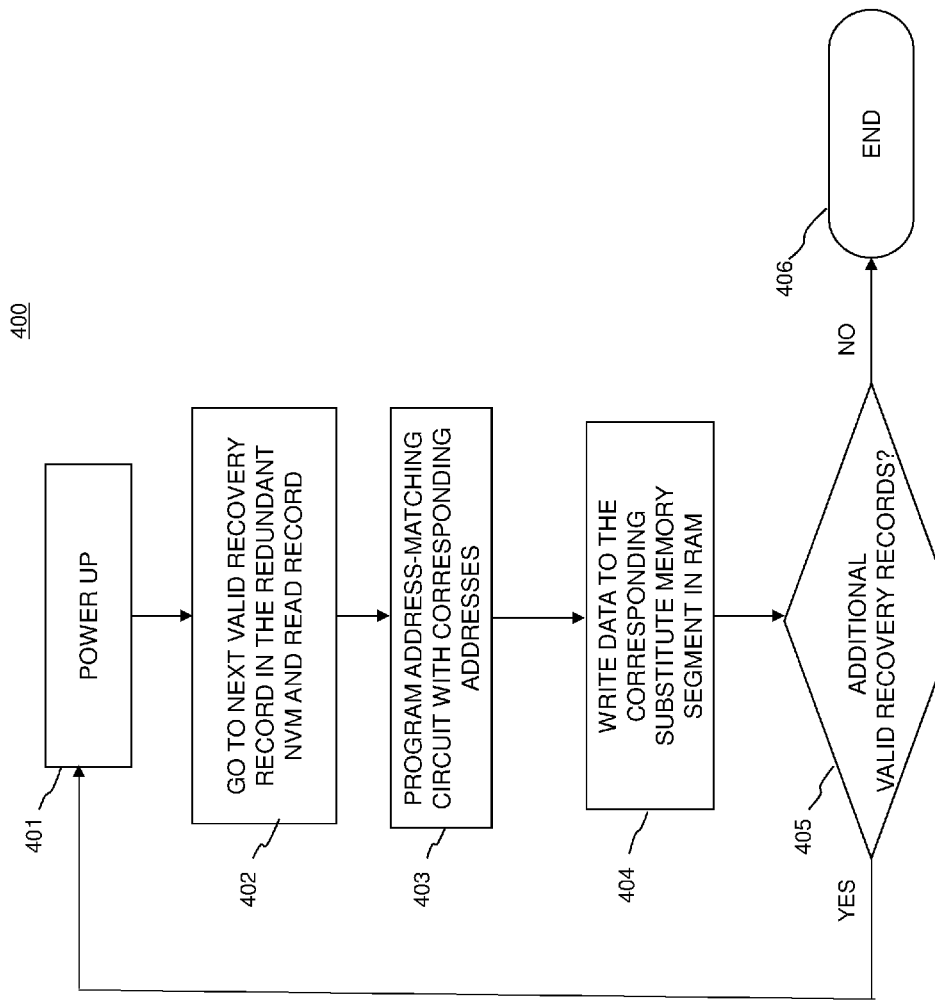
FIG. 4 is a flow chart for a process for the initialization of the portion of the NVM system of FIG. 2 following power up.

FIG. 4 is a flow chart for a process 400 for the initialization of the NVM system 200 of FIG. 2 following power up (step 401). Since the address-matching circuit 204 and the RAM 205 are volatile devices, they will lose their information when the NVM system 200 is powered down. Following device power up (step 401), the NVM controller 201 finds the valid record in the redundant NVM sector 203 by analyzing the state of the validity flags for non-empty records and reads the rest of the contents of the record (step 402). The NVM controller 201 then (i) programs a memory section 209 in the address-matching circuit 204 with the main address of the bad memory segment 207 and the address of the corresponding substitute RAM memory segment 210 (step 403) and (ii) programs the corresponding RAM memory segment 210 with the data intended for storage in the bad memory segment 207 (step 404). If there are additional valid recovery records (step 405), then the process returns to step 402, and if there are not (step 405), then the process terminates (step 406).

Figure 5:
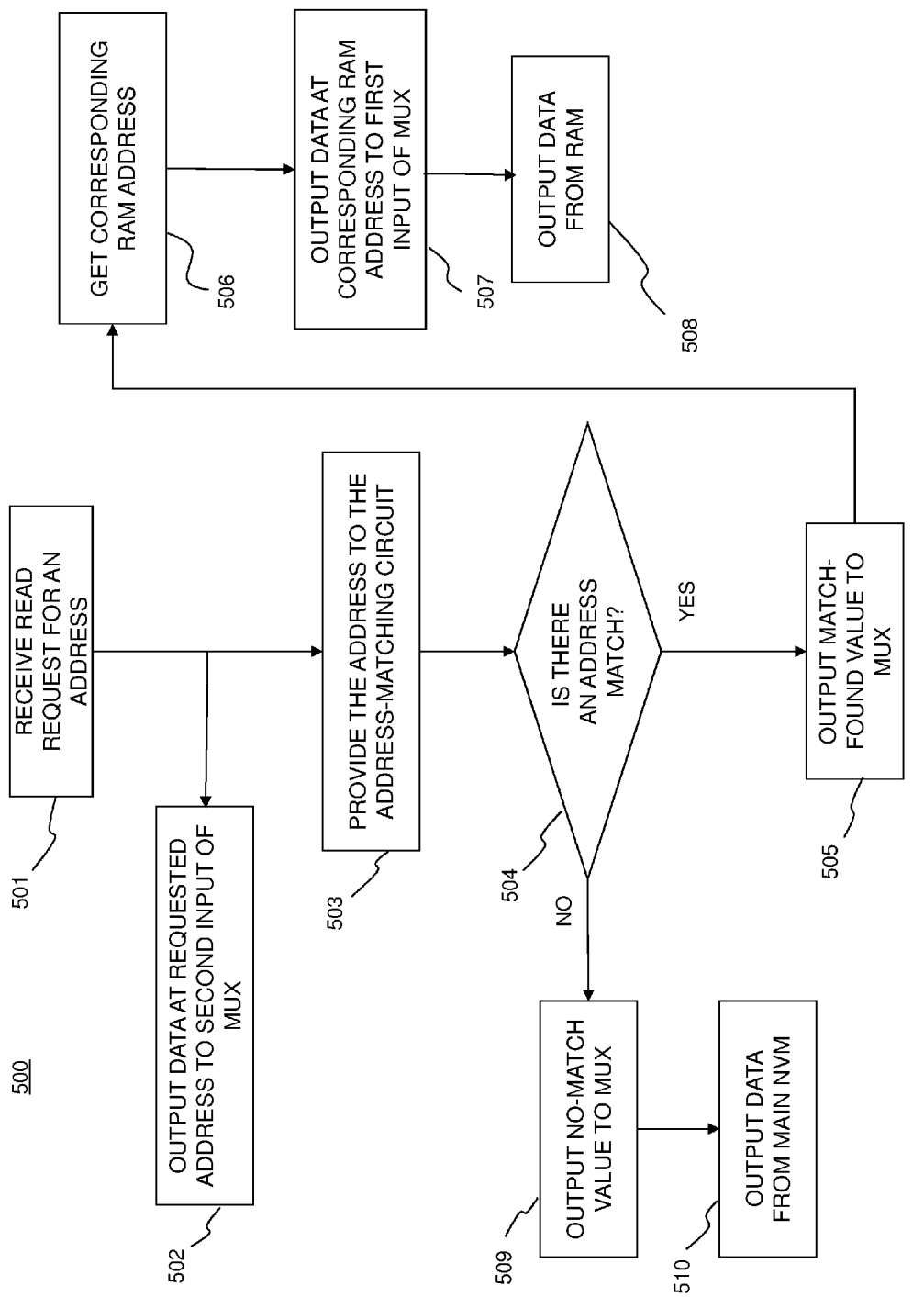
FIG. 5 is a flow chart for a process for a read operation performed by the portion of the NVM system of FIG. 2.

FIG. 5 is a flow chart for a process 500 for a read operation performed by the NVM system 200 of FIG. 2. When another device component (not shown) requests to read the data stored in a particular memory segment 207, that request is provided to the NVM controller 201 via path 201a (step 501). The NVM controller 201 provides the requested reference address to both (i) the main NVM sector 202, which outputs the corresponding data via the path 202b to the second input of the mux 206 (step 502) and (ii) to the address-matching circuit 204 (step 503).

If the address-matching circuit 204 has a matching address (step 504)—indicating that the corresponding memory segment 207 is bad—then (i) a match-found value—e.g., 1—is provided to the selector input of the mux 206 via the path 204b (step 505), (ii) the substitute address of the corresponding RAM memory segment is retrieved and provided to the RAM 205 (step 506), (iii) the RAM 205 provides the data in the RAM memory segment at the substitute address to a first input of the mux 206 via the path 205b (step 507), and (iv) the mux 206 outputs via path 206a the data received from the RAM 205 (step 508).

If, on the other hand, the address-matching circuit 204 does not have a matching address (step 504)—indicating that the corresponding memory segment 207 is good—then (i) a match-not-found value—e.g., 0—is provided to the selector input of the mux 206 via the path 204b (step 509) and (ii) the mux 206 outputs via path 206a the data received at the second input from the main NVM sector 202 via the path 202b (step 510).

Figure 6:
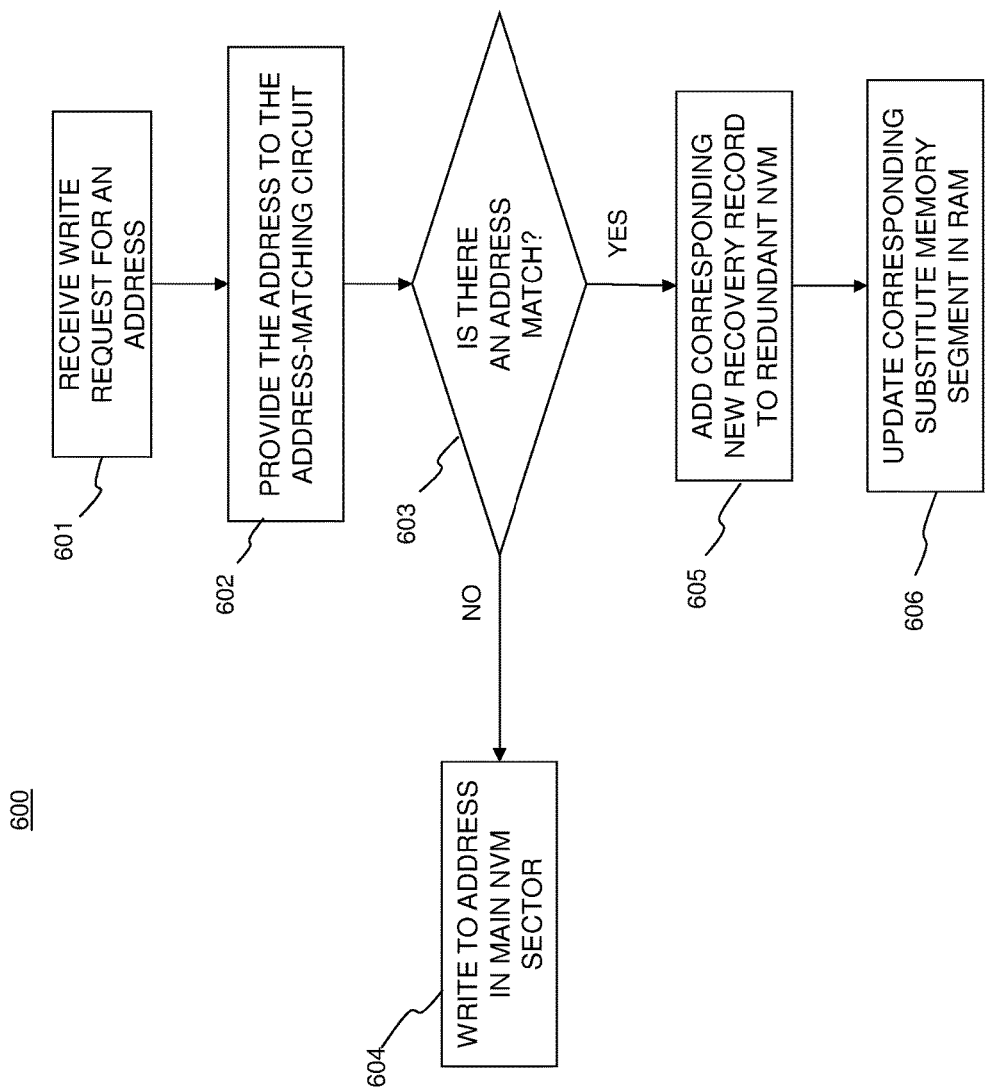
FIG. 6 is a flow chart for a process for a write operation performed by the NVM system of FIG. 2.

FIG. 6 is a flow chart for a process 600 for a write operation performed by the NVM system 200 of FIG. 2. When another device component requests to write to a memory segment 207 of the main NVM sector 202, the request is provided to the NVM controller 201 via the path 201a (step 601). The NVM controller 201 provides the address of the memory segment 207 to the address-matching circuit 204 (step 602). If there is no match (step 603)—indicating that the corresponding memory segment 207 is good—then the memory segment 207 is programmed as requested (step 604). If, on the other hand, a match is found by the address-matching circuit 204 (step 603)—indicating that the requested memory segment 207 is bad, then the NVM controller 201 (i) creates a new record in the redundant NVM sector 203, as described above, with the write-request's new data (step 605) and (ii) updates the contents of the corresponding RAM memory segment 210 with the write-request's new data (step 606). Note that a similar process may be used when erasing the main NVM sector 202. Specifically, the addresses of the memory sectors 207 are checked for matches by the address-matching circuit 204 and, for any matching addresses, (i) corresponding new recovery records are added to the redundant NVM sector 203 and (ii) the contents of the corresponding RAM memory segments 210 are updated.

The NVM controller 201 may additionally mark the previously corresponding record of the redundant NVM sector 203 as invalid by programming the record's validity flag. The NVM controller 201 may find the previously corresponding record by searching through all of the records in the redundant NVM sector 203 for the address of the requested memory segment 207.

Over time, as the main NVM sector 202 is erased and new data is repeatedly written to any bad memory segments 207 of the main NVM sector 202, the redundant NVM sector 203 may develop a growing number of memory segments 208 marked as invalid. These invalid memory segments 208 represent previously used storage in the redundant NVM sector 203, which may become usable again after the redundant NVM sector 203 is erased (recall that the memory segments 208 are not individually erasable). At or below a predetermined threshold, redundant-sector compression may be performed, as described below. The threshold may be, for example, a certain number of the memory segments 208 of the redundant NVM sector 203 that are not used (e.g., erased and not reprogrammed) and, consequently, available for new recovery records. Performing compression may also depend on the number and/or percentage of invalid records in the redundant NVM sector 203, since it may be wasteful to perform a compression process on a sector with no—or few—invalid records. The threshold and the number or percentage figures are maintained by the NVM controller 201 and may be stored, for example, in the redundant NVM sector 203 itself, in a header associated with the redundant NVM sector 203, or in a firmware NVM sector (not shown) used by the NVM controller 201 to store its firmware.

Figure 7:
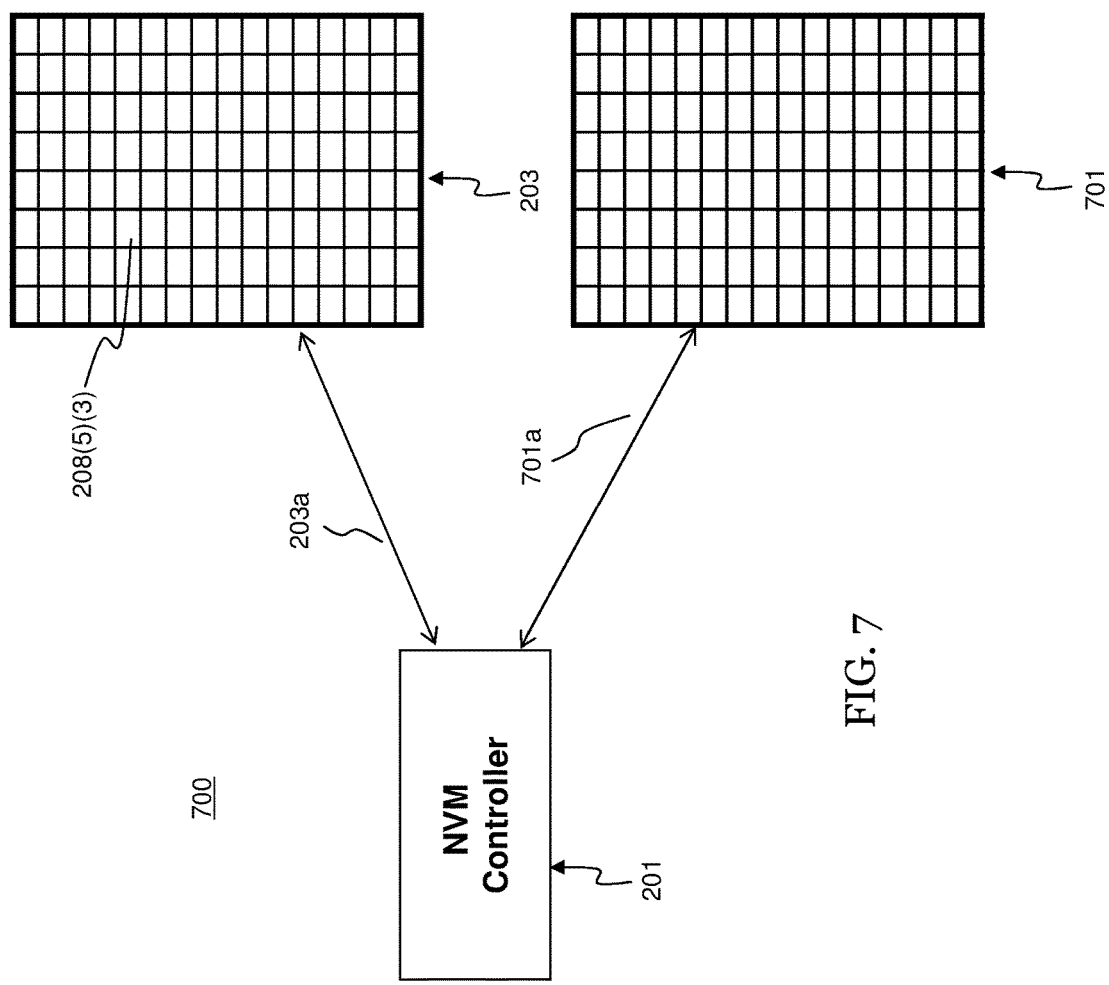
FIG. 7 is a simplified block diagram of a different exemplary portion for the NVM system of FIG. 2 that partially overlaps the portion of FIG. 2.

FIG. 7 is a simplified block diagram of an exemplary portion 700 partially overlapping the portion of NVM system 200 of FIG. 2. Portion 700 comprises the NVM controller 201 and the redundant NVM sector 203 of FIG. 2 as well as another redundant NVM sector 701. The redundant NVM sector 701 is connected to the NVM controller 201 via a path 701a and is initially clean or, in other words, erased or unprogrammed.

Figure 8:
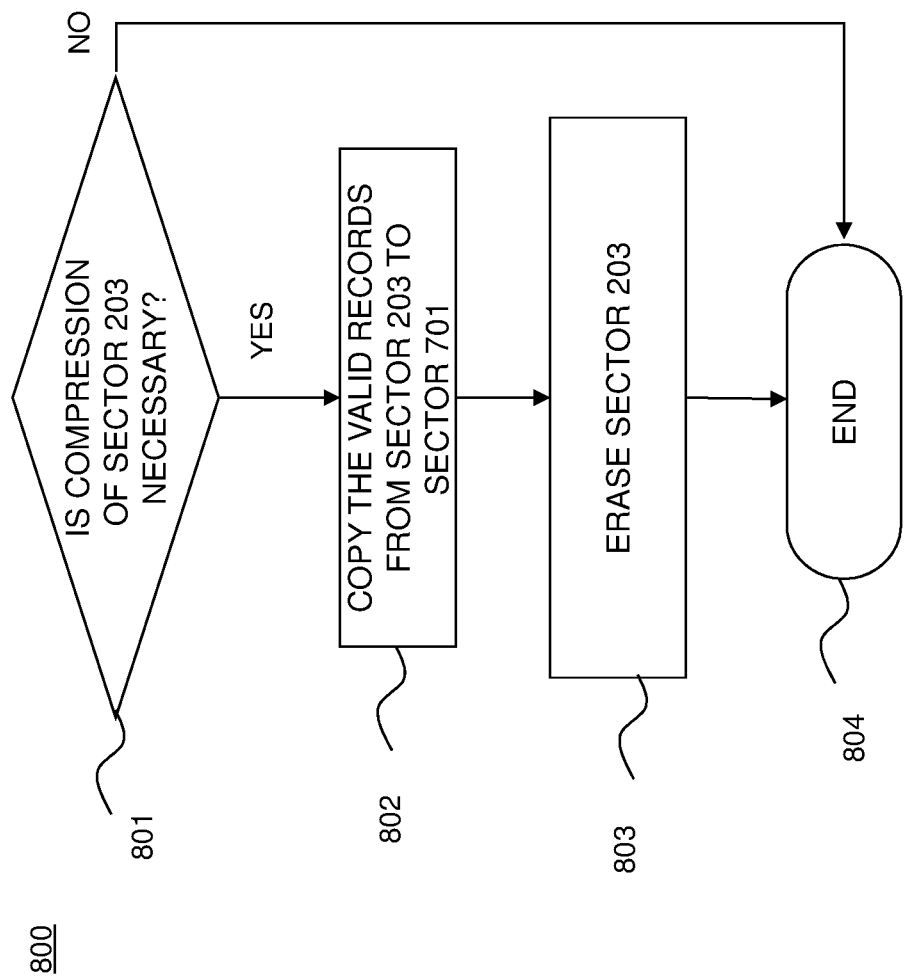
FIG. 8 is a flow chart for a compression process for the portion of the NVM system of FIG. 7.

FIG. 8 is a flow chart for a compression process 800 for the portion 700 of the NVM system of FIG. 7. If the NVM controller 201 determines that compression of redundant NVM sector 203 is warranted (step 801), e.g., if the number of available memory segments 208 in the redundant NVM sector 203 falls below a first predetermined threshold and the redundant NVM sector 203 contains more than a second predetermined threshold of invalid record, then the NVM controller 201 copies the valid records from the redundant NVM sector 203 to new records in the clean redundant NVM sector 701 (step 802), while the invalid records are not copied, resulting in compression. The redundant NVM sector 203 is then erased (step 803) and itself becomes a clean, redundant NVM sector available for use by the NVM controller 201. The process then terminates (step 804). If, on the other hand, in step 801, the NVM controller 201 determines that compression is not warranted, then the process terminates (step 804). Note that the process 800 may then be performed on a next redundant NVM sector.

It should be noted that the NVM system of FIGS. 2 and 7 may have additional main and redundant NVM sectors that operate in the same way as the exemplary sectors described. Alternative embodiments may have any suitable number of main and redundant NVM sectors operating in any suitable manner in accordance with the invention.

In a first alternative embodiment, the RAM 205 is omitted. In this alternative embodiment, the main and substitute addresses stored by a memory section 209 of the address-matching circuit 204 are, respectively, the address of a bad memory segment 207 and the address of the corresponding recovery record in the redundant NVM sector 203. Each record in the redundant NVM sector 203 no longer needs to store a corresponding RAM address and may, instead, store its own address, which may permit simpler operation. Note that this embodiment may operate more slowly than embodiments with a RAM since reading data from a RAM memory segment is generally faster than reading from an NVM record.

On power-up of the first alternative embodiment, the address-matching circuit 204 is populated with the addresses of the bad memory segment 207 and the corresponding recovery-record addresses by reading the valid records in the redundant NVM sector 203. A corresponding recovery-record address may be obtained from the recovery record itself or by determining the address of the recovery record in an implementation where the recovery record does not include its own address. In response to a read request for a given reference address, if the matching-address circuit 204 finds a matching address, then the matching-address circuit 204 provides the substitute address of the corresponding recovery record to the NVM controller 201, and the NVM controller 201 outputs the data stored in the recovery record at the substitute address. If the NVM controller 201 determines that a new memory segment 207 is bad, then a corresponding record is created in the redundant NVM sector 203, and the address-matching circuit 204 is programmed with the corresponding main and substitute addresses in accordance with the above description.

An embodiment of the invention has been described where the size of the memory segments of each main NVM sector is the same as the size of the memory segments of each redundant NVM sector, which is also the same as the data-bus width for the NVM system. In this embodiment, two memory segments of the redundant NVM memory sector are typically used to store a recovery record for one defective memory segment of the main NVM sector. The invention is not, however, so limited. In some alternative embodiments, the size of the memory segments of one or more main NVM sectors and/or redundant NVM sectors may be different from the data-bus width for the corresponding NVM system. For example, in one embodiment where recovery records align with redundant memory segments, the memory segments of each redundant NVM sector are sized to equal the sum of the sizes of (i) a main NVM sector memory segment, (ii) a main NVM sector memory segment address, (iii) a substitute address, and (iv) a status flag.

Embodiments of the invention have been described having blocks, sectors, memory segments, words, and bytes of particular sizes and in particular arrangements. It should be noted, however, that those sizes and arrangements are exemplary. Alternative implementations may have bytes having fewer or more than eight bits. Alternative implementations may have memory blocks, sectors, and/or memory segments of any suitable size and in any suitable arrangement. Note that alternative embodiments of the invention may have different sector sizes for main NVM sectors and redundant NVM sectors.

Exemplary embodiments of the invention have been described where an address-matching circuit has a particular number of memory sections. The invention is not, however, so limited. Alternative embodiments may comprise one or more address-matching circuits having any suitable number of memory sections.

Exemplary embodiments of the invention have been described where a RAM has a particular number of memory segments. The invention is not, however, so limited. Alternative embodiments may comprise one or more RAM modules having any suitable number of memory segments. Typically, the RAM modules of an NVM system would have as many memory segments as there are memory modules in the corresponding address-matching circuit of the NVM system.

Exemplary embodiments of the invention have been described where the data-bus width is 64 bits. The invention is not, however, so limited. In alternative embodiments of the invention, the width of the data bus for accessing memory may be of any suitable number of bits, greater or smaller than 64. The size of the memory segments in the NVM sectors of these alternative embodiments would, accordingly, correspond to the respective alternative data-bus width.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used herein in reference to data transfers between entities in the same device, and unless otherwise specified, the terms "receive" and its variants can refer to receipt of the actual data, or the receipt of one or more pointers to the actual data, wherein the receiving entity can access the actual data using the one or more pointers.

Exemplary embodiments have been described wherein particular entities perform particular functions. However, the particular functions may be performed by any suitable entity and are not restricted to being performed by the particular entities named in the exemplary embodiments.

Exemplary embodiments have been described with data flows between entities in particular directions. Such data flows do not preclude data flows in the reverse direction on the same path or on alternative paths that have not been shown or described. Paths that have been drawn as bidirectional do not have to be used to pass data in both directions.

The term "non-volatile memory," as used herein, refers to any type of memory that substantially retains its stored contents after disconnection from its power supply, i.e., the stored contents can be retrieved after reconnecting the non-volatile memory to a power supply. Examples of non-volatile memory include, but are not necessarily limited to (i) charge-storing devices such as EPROM and EEPROM and flash ROM, (ii) magnetic media devices such as hard drives and tapes, (iii) optical, opto-electrical, and opto-magnetic media such as CDs and DVDs, and (iv) fuse/anti-fuse-based memory. Note that, since some types of memory, such as certain CDs, DVDs, and fuse/anti-fuse-based memory, are not be reprogrammable, aspects of the disclosure corresponding to reprogramming of NVM sectors would not apply to those types of memory.

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

The invention claimed is:

1. A non-volatile memory (NVM) system, comprising:
a first main NVM sector comprising a plurality of memory segments, each memory segment having an address and adapted to store data associated with the memory segment;
an address-matching circuit comprising a plurality of memory sections, each memory section adapted to store a main address and a substitute address;
a first redundant NVM sector adapted to store a plurality of recovery records, wherein each recovery record comprises:
the address of a corresponding defective memory segment of the first main NVM sector;
the data associated with the corresponding defective memory segment; and
the substitute address for the corresponding defective memory segment; and
a random-access memory (RAM) comprising a plurality of memory segments, wherein each memory segment of the RAM is addressable by an address and is adapted to store the data associated with a corresponding defective memory segment of the first main NVM sector, wherein:
the main address is the address of a defective memory segment of the first main NVM sector;

the substitute address identifies a substitute location in the NVM system that stores the data associated with the defective memory segment; and when the NVM system receives a read request for a requested memory segment in the first main NVM sector, the NVM system determines whether the requested memory segment is defective by determining if the address of the requested memory segment matches the main address stored by the address-matching circuit such that:

if the NVM system determines that the requested memory segment is defective, then (i) the address-matching circuit provides the corresponding stored substitute address for the matching main address and (ii) the NVM system outputs the data stored at the corresponding substitute address; and otherwise, the NVM system outputs the data stored in the requested memory segment, and wherein:

for each recovery record of the first redundant NVM sector, the substitute address for the corresponding defective memory segment is the address of the corresponding memory segment of the RAM; and for each main address of the address-matching circuit, the substitute address is the address of the corresponding memory segment of the RAM.

2. The NVM system of claim 1, wherein, for each recovery record in the first redundant NVM sector, the NVM system is adapted to program a corresponding memory section of the address-matching circuit with (i) the address of the corresponding defective memory segment of the first main NVM sector as the main address and (ii) a corresponding substitute address as the substitute address.

3. The NVM system of claim 1, wherein:
each recovery record is addressable by an address in the first redundant NVM sector;
the corresponding substitute address for each recovery record is the address of the recovery record in the first redundant NVM sector.

4. The NVM system of claim 1, wherein:
the memory sections of the address-matching circuit are volatile memory sections;
the NVM system is adapted to program a corresponding memory section of the address-matching circuit during a power-up procedure of the NVM system with (i) the address of the corresponding defective memory segment of the first main NVM sector as the main address, and (ii) the corresponding substitute address as the substitute address.

5. The NVM system of claim 1, wherein:
each recovery record further comprises a validity flag;
the validity flag is set to valid by default; and
if new data is associated with the corresponding defective memory segment of the first main NVM sector, then:
the NVM system sets the validity flag of the corresponding recovery record to invalid; and
the NVM system adds a new recovery record corresponding to the defective memory segment of the first main NVM sector and including the new data.

6. The NVM system of claim 5, wherein:
the first redundant NVM sector is erasable by sector;
the first redundant NVM sector comprises a plurality of memory segments comprising (i) a programmed subset that is programmed with recovery records and (ii) an unprogrammed subset that is not programmed with recovery records;

the NVM system further comprises a second redundant NVM sector comprising a plurality of unprogrammed memory segments; and
the NVM system is adapted to compress the first redundant NVM sector, wherein compression comprises:
determining that the size of the unprogrammed subset is smaller than a threshold;
copying the valid recovery records of the first redundant NVM sector to the second redundant NVM sector; and
erasing the first redundant NVM sector.

7. The NVM system of claim 1, further comprising:
one or more additional main NVM sectors; and
one or more additional redundant NVM sectors.

8. The NVM system of claim 1, further comprising an NVM controller that communicates with the first main NVM sector, the first redundant NVM sector, and the address-matching circuit.

9. The NVM system of claim 1, wherein the NVM system is adapted to:
write data to a first memory segment of the first main NVM sector;
perform a verification of the data written to the first memory segment; and
if the verification fails, then:
determine that the first memory segment is defective;
add a corresponding recovery record to the first redundant NVM sector, the recovery record comprising the address of the first memory segment, the data, and a substitute address;
program a corresponding memory section of the address-matching circuit with the address of the first memory segment and the substitute address; and
store the data at the substitute address.

10. The NVM system of claim 1, wherein the NVM system is adapted to:
erase the first main NVM sector;
perform a verification of the erasure of the first main NVM sector; and
if the verification fails for a first memory segment, then:
determine that the first memory segment is defective;
add a corresponding recovery record to the first redundant NVM sector, the recovery record comprising the address of the first memory segment and a substitute address; and
program a corresponding memory section of the address-matching circuit with the address of the first memory segment and the substitute address.

11. The NVM system of claim 1, wherein:
the address-matching circuit provides a match output indicating whether the address of the requested memory segment matches a stored main address;
the NVM system further comprises a mux controlled by the match output and connected to receive data from (i) the first main NVM sector and (ii) the RAM; and
in response to the read request:
if the match output indicates a match, then the mux outputs the data at the substitute address in the RAM; and
if the match output indicates a no match, then the mux outputs the data at the requested address in the first main NVM sector.

12. The NVM system of claim 1, wherein:
the memory segments of the first main NVM sector are arranged as an array comprising a plurality of rows and a plurality of columns;

memory segments in the same row share common word lines; and memory segments in the same column share common bit lines.

13. The NVM system of claim 1, wherein the address-matching circuit comprises content-addressable memory configured to store the main address and the substitute address of each defective memory segment in the first main NVM sector.

* * * * *